US012787846B2

(12) United States Patent
Yoo et al.

(10) Patent No.: US 12,787,846 B2
(45) Date of Patent: Nov. 3, 2026

(54) RELEASE FILM AND METHOD OF MANUFACTURING SEMICONDUCTOR PACKAGE USING THE SAME

(71) Applicant: Samsung Electronics Co., Ltd., Suwon-si (KR)

(72) Inventors: Hansol Yoo, Sejong-si (KR); Wonkeun Kim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 942 days.

(21) Appl. No.: 17/852,853

(22) Filed: Jun. 29, 2022

(65) Prior Publication Data

US 2023/0135089 A1 May 4, 2023

(30) Foreign Application Priority Data

Nov. 3, 2021 (KR) ........................ 10-2021-0149730

(51) Int. Cl.

| | |
|---|---|
| ***H10W 74/01*** | (2026.01) |
| ***B29C 33/68*** | (2006.01) |
| ***B29L 31/34*** | (2006.01) |
| ***B32B 5/02*** | (2006.01) |
| ***B32B 7/06*** | (2019.01) |
| ***B32B 27/12*** | (2006.01) |
| ***B32B 27/30*** | (2006.01) |

(52) U.S. Cl.

CPC ........... *H10W 74/017* (2026.01); *B29C 33/68* (2013.01); *B32B 5/022* (2013.01); *B32B 5/024* (2013.01); *B32B 7/06* (2013.01); *B32B 27/12* (2013.01); *B32B 27/304* (2013.01); *B29L 2031/3406* (2013.01); *B32B 2307/202* (2013.01); *B32B 2307/732* (2013.01)

(58) Field of Classification Search

CPC .... H01L 21/566; H10W 74/017; B29C 33/68; B29C 51/30

See application file for complete search history.

(56) References Cited

U.S. PATENT DOCUMENTS

| | | | | |
|---|---|---|---|---|
| 10,578,778 | B2 | 3/2020 | Morimoto et al. | |
| 10,854,357 | B2 | 12/2020 | Matsubayashi et al. | |
| 2005/0084684 | A1* | 4/2005 | Yamamoto | B32B 7/06 428/422 |
| 2012/0315499 | A1 | 12/2012 | Isaki et al. | |
| 2016/0362565 | A1 | 12/2016 | Fornes et al. | |
| 2016/0368177 | A1* | 12/2016 | Kasai | B29C 33/68 |
| 2019/0232621 | A1* | 8/2019 | Van Riel | C08J 7/046 |
| 2023/0395398 | A1* | 12/2023 | Kotera | H10W 74/01 |

FOREIGN PATENT DOCUMENTS

| | | | | | |
|---|---|---|---|---|---|
| CN | 1606144 | A | * | 4/2005 | H10P 72/7402 |
| CN | 116867645 | A | * | 10/2023 | H10P 50/00 |
| KR | 10-1024091 | B1 | | 3/2011 | |
| KR | 10-20160130804 | A | | 11/2016 | |
| KR | 10-2018-0072716 | A | | 6/2018 | |
| KR | 10-2059117 | B1 | | 12/2019 | |
| WO | WO-2011122023 | A1 | * | 10/2011 | H05K 3/281 |

* cited by examiner

*Primary Examiner* — Wael M Fahmy
*Assistant Examiner* — Quinton A Brasfield
(74) *Attorney, Agent, or Firm* — Fish & Richardson P.C.

(57) ABSTRACT

A release film may include a conductive polymer substrate layer, and release layers provided on a top surface and a bottom surface of the conductive polymer substrate layer. Each of the release layers may include a fluorine-based polymer, and a density of the conductive polymer substrate layer ranges from 0.1 g/cm$^3$ to 0.5 g/cm$^3$.

14 Claims, 6 Drawing Sheets

RELEASE FILM AND METHOD OF MANUFACTURING SEMICONDUCTOR PACKAGE USING THE SAME

CROSS-REFERENCE TO RELATED APPLICATIONS

This U.S. non-provisional patent application claims priority under 35 U.S.C. § 119 to Korean Patent Application No. 10-2021-0149730, filed on Nov. 3, 2021, in the Korean Intellectual Property Office, the entire contents of which are hereby incorporated by reference.

BACKGROUND OF THE INVENTION

The present disclosure relates to a release film and/or a method of manufacturing a semiconductor package using the same.

A molding process, which is a part of a semiconductor device packaging process, is performed to encapsulate a substrate and a semiconductor device mounted thereon with a molding material. A mold and a molding material may be used to hermetically encapsulate the semiconductor device. An epoxy molding compound (EMC), which is composed of an epoxy resin and various inorganic and subsidiary materials added therein, is mainly used as the molding material. The molding material is injected into the mold, during a shaping process. In the packaging process, a release film, which is interposed between the mold and the molding material, is used to detach the shaped product from the mold, after hardening the molding material.

SUMMARY

Example embodiments of the inventive concepts provide a way of suppressing an issue of static electricity, which may occur when a molding material is detached from a release film.

According to an embodiment of the inventive concepts, a release film may include a conductive polymer substrate layer, and release layers on a top surface and a bottom surface of the conductive polymer substrate layer. Each of the release layers may include a fluorine-based polymer, and a density of the conductive polymer substrate layer ranges from 0.1 g/cm$^3$ to 0.5 g/cm$^3$.

According to an embodiment of the inventive concepts, a release film may include a conductive polymer substrate layer, and release layers on a top surface and a bottom surface of the conductive polymer substrate layer. Each of the release layers may include a fluorine-based polymer, the conductive polymer substrate layer may have a thickness between 40 μm to 80 μm, and each of the release layers may have a thickness between 0.5 μm to 5 μm.

According to an embodiment of the inventive concepts, a method of manufacturing a semiconductor package may include disposing a release film to cover a cavity of a mold, disposing a molding member on the release film, positioning a substrate such that a semiconductor device mounted on a first surface of the substrate is over the cavity; moving the mold toward the first surface of the substrate such that the molding member covers at least a portion of the first surface of the substrate, hardening the molding member to form a molding structure, and detaching the molding structure from the release film. The release film may include a conductive polymer substrate layer and release layers on a top surface and a bottom surface of the conductive polymer substrate layer. Each of the release layers may include a fluorine-based polymer.

DETAILED DESCRIPTION

Figure 1:
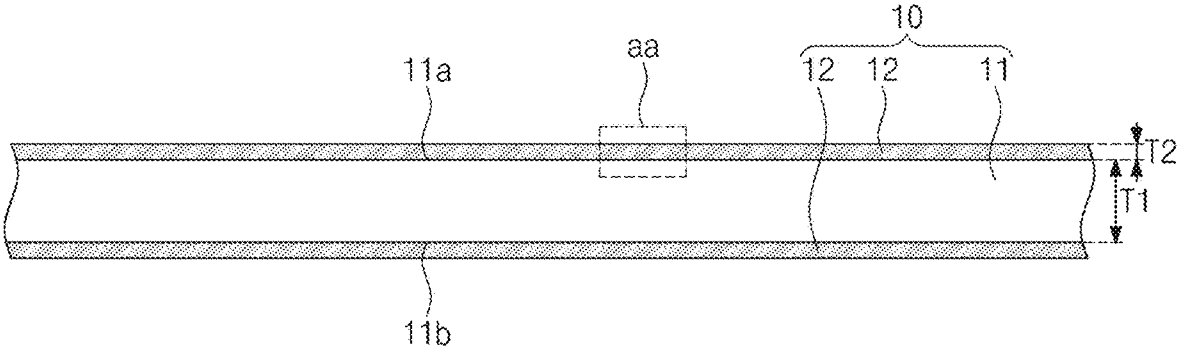
FIG. 1 is a sectional view schematically illustrating a release film according to some example embodiments.

Example embodiments of the inventive concepts will now be described more fully with reference to the accompanying drawings, in which example embodiments are shown. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Unless otherwise noted, like reference characters denote like elements throughout the attached drawings and written description, and thus descriptions will not be repeated.

Spatially relative terms, such as "top," "bottom," and/or the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, the device may be otherwise oriented (rotated 90 degrees or at other orientations) and the spatially relative descriptors used herein interpreted accordingly.

Figure 2:
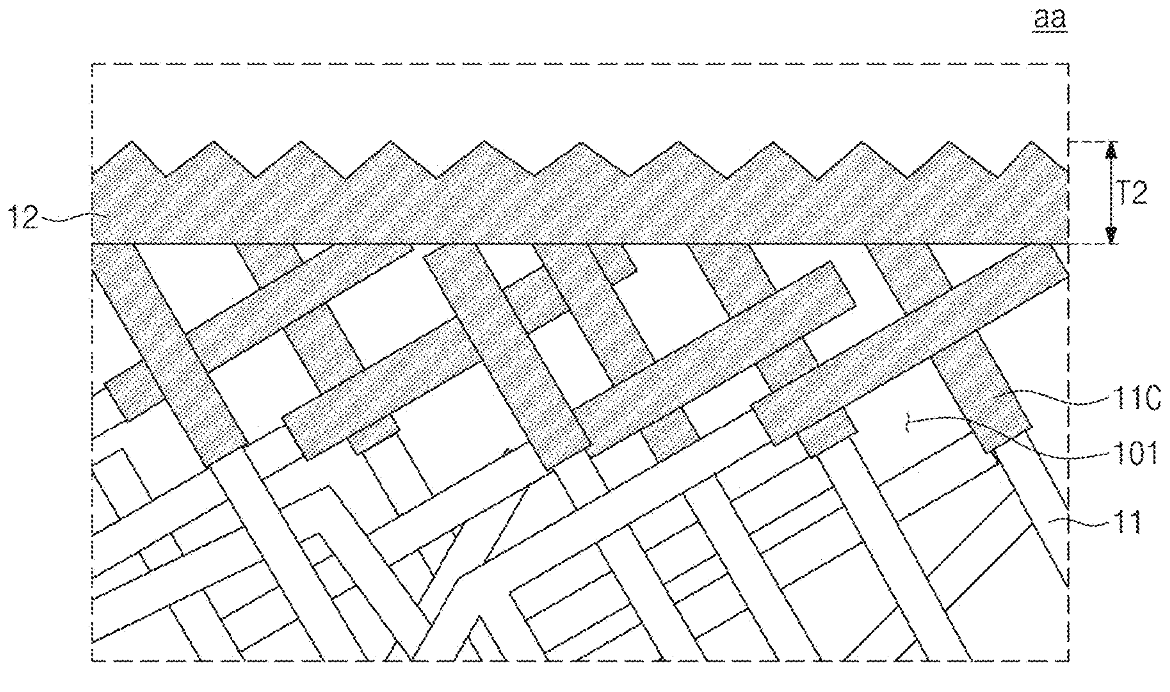
FIG. 2 is an enlarged sectional view illustrating a portion 'aa' of FIG. 1.

FIG. 1 is a sectional view schematically illustrating a release film 10 according to some example embodiments. FIG. 2 is an enlarged sectional view illustrating a portion 'aa' of FIG. 1.

Referring to FIGS. 1 and 2, a release film 10 may include a conductive polymer substrate layer 11 and a pair of release layers 12.

The conductive polymer substrate layer 11 may include a first surface 11*a* and a second surface 11*b*, which are opposite to each other. The release layers 12 may be respectively provided on the first and second surfaces 11*a* and 11*b* of the conductive polymer substrate layer 11. Each of the release layers 12 may be in contact with the conductive polymer substrate layer 11.

The conductive polymer substrate layer 11 may have a woven or non-woven fabric structure. In some embodiments, the conductive polymer substrate layer 11 may include a porous conductive fiber and/or the conductive polymer substrate layer 11 may include a porous fiber and a conductive polymer material coated on the porous fiber. For example, as shown in FIG. 2, the conductive polymer substrate layer 11 may include fibers and a plurality of pores 101 which are empty spaces defined between the fibers.

The porous fiber may be formed of and/or include at least one of polyethylene naphthalate, polyimide, nylon, polyester, and/or the like. The conductive polymer material may include at least one of poly(3,4-ethylenedioxythiophene) polystyrene sulfonate (PEDOT:PSS), polypyrrole, polythiophene, polyaniline, and/or the like.

The release layer 12 may include a fluorine-based polymer. For example, the release layer 12 may be formed of and/or include at least one material including one or more C—F bonds (e.g., fluoropolymer and perfluoropolymer). For example, the release layer 12 may be formed of and/or include at least one fluorine-based polymer (e.g., ethylene tetrafluoroethylene (ETFE), polytetrafluoroethylene (PTFE), and perfluorooctanoic acid (PFOA)). As shown in FIG. 2, the release layer 12 may have an uneven surface (such as a fine concavo-convex structure), which is placed opposite to the conductive polymer substrate layer 11. In some embodiments, the conductive polymer substrate layer 11 may include a contact portion 11C, which is located near the release layer 12 and is coated with the release layer 12.

The conductive polymer substrate layer 11 may have a first thickness T1, and each of the release layers 12 may have a second thickness T2. The first thickness T1 may be at least ten times larger than the second thickness T2. As an example, the first thickness T1 may range from 30 μm to 150 μm and/or the second thickness T2 may range from 0.1 μm to 20 μm. In some example embodiments, the first thickness T1 may range from 40 μm to 80 μm, and/or the second thickness T2 may range from 0.5 μm to 5 μm.

Due to the presence of the pores 101, the conductive polymer substrate layer 11 may have a density lower than the release layer 12. As an example, the density of the conductive polymer substrate layer 11 may range from 0.1 g/cm$^3$ to 0.5 g/cm$^3$ and/or the density of the release layer 12 may range from 1.5 g/cm$^3$ to 2.3 g/cm$^3$.

If the density of the conductive polymer substrate layer 11 is lower than 0.1 g/cm$^3$, the pores 101 may be clogged with the release layer 12 when the conductive polymer substrate layer 11 is coated with the release layer 12, as will be described below. In addition, in a stretching process on the release film 10, which will be described with reference to FIGS. 7 and 8, the release film 10 may not exhibit a conductive property or the conductive polymer substrate layer 11 may be torn.

If the density of the conductive polymer substrate layer 11 is higher than 0.5 g/cm$^3$, the conductive polymer substrate layer 11 may have a poor stretching property. As a result, in steps of FIGS. 6 and 7, the release film 10 may not be in close contact with an inner bottom surface 312 and an inner side surface 322 of a mold 30, and in these cases, it may be difficult to realize a desired molding shape.

In the case where the second thickness T2 of the release layer 12 is large (e.g., larger than 20 μm), the conductive polymer substrate layer 11 may not be exposed by the stretching process on the release film 10 to be described with reference to FIGS. 7 and 8.

In the case where the second thickness T2 of the release layer 12 is small (e.g., smaller than 0.1 μm), the conductive polymer substrate layer 11 may have a portion that is in direct contact with a molding member 42 even in the step before the stretching process on the release film 10. In this case, the conductive polymer substrate layer 11 may be strongly attached to the molding member 42 in a process of hardening the molding member 42 of FIG. 9 to be described below, and thus, it may not be easily detached from the molding member 42 in the detaching process.

A weight of the release layers 12 may account for 1% to 10% of a total weight of the release film 10. As an example, a weight ratio of the conductive polymer substrate layer 11 to the release layers 12 may range from 8:1 to 9:1.

A sheet resistance of the release film 10 may be greater than or equal to $10^8$ Ω/sq and/or may be smaller than $10^{10}$ Ω/sq. In some example embodiments, the sheet resistance of the release film 10 may be about $10^9$ Ω/sq.

Figure 3:
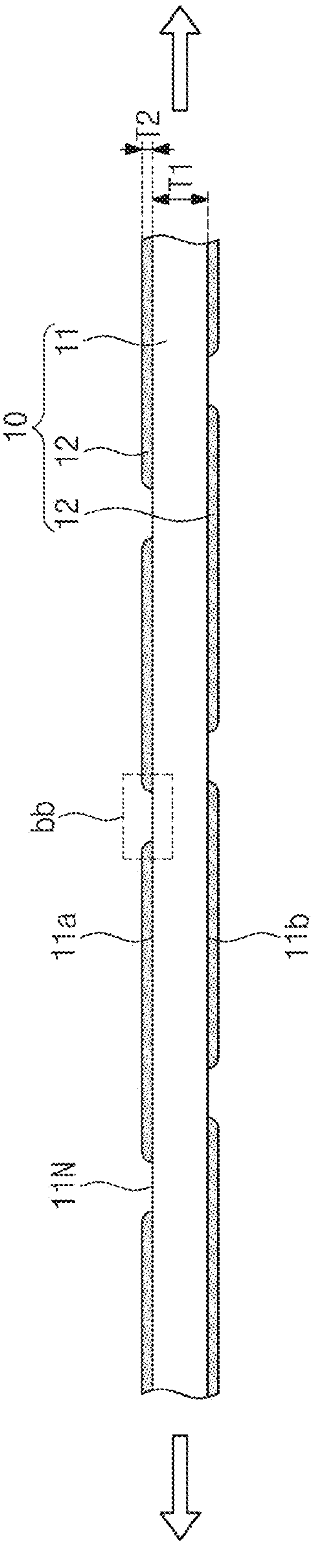
FIG. 3 is a sectional view illustrating a structure obtained by stretching the release film of FIG. 1.
Figure 4:
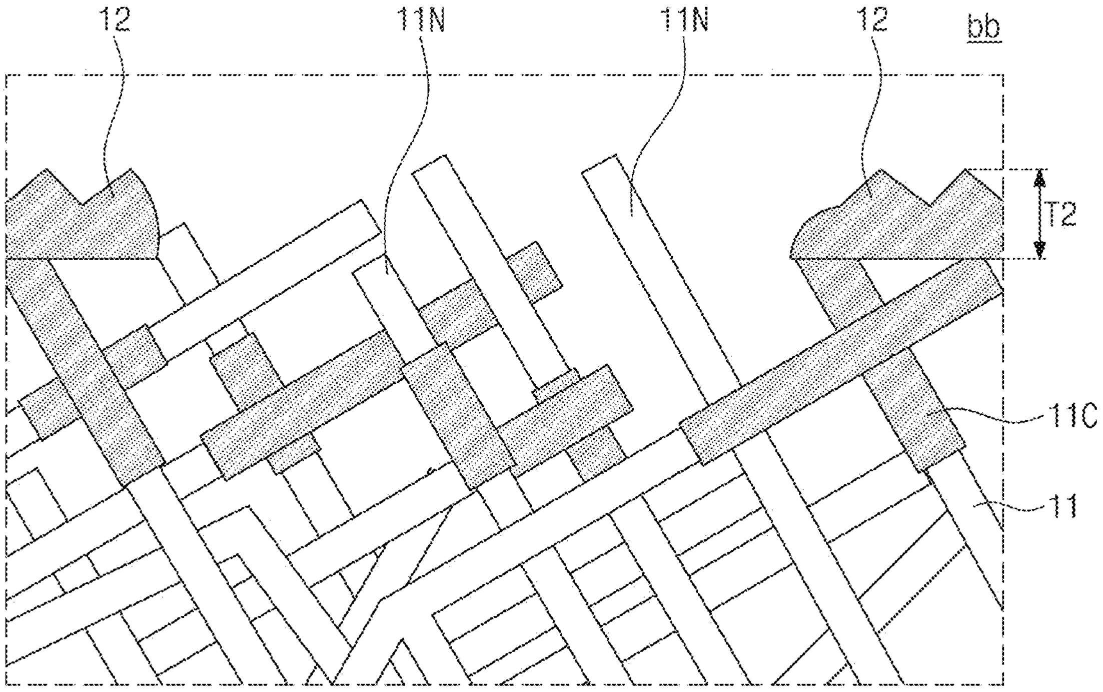
FIG. 4 is an enlarged sectional view illustrating a portion 'bb' of FIG. 3.

FIG. 3 is a sectional view illustrating a structure obtained by stretching the release film of FIG. 1. FIG. 4 is an enlarged sectional view illustrating a portion 'bb' of FIG. 3.

Referring to FIG. 3, the release film 10 may be stretched by an external force. During the stretching process, a length of the release film 10 may be increased in a direction parallel to the external force but may be decreased in a direction perpendicular to the external force. As a result, both of the first and second thicknesses T1 and T2 may be decreased by the stretching process.

In some embodiments, during the stretching process, the release layer 12 may be cut to form a plurality of portions. As a result, the conductive polymer substrate layer 11 may be exposed through regions between the cut portions of the release layer 12. The exposed portion 11N of the conductive polymer substrate layer 11 may protrude toward the outside of the release layer 12, depending on a direction of the external force applied during the stretching process.

In some example embodiments, the release layer 12 may have a stretching property that is better than the conductive polymer substrate layer 11, under the same condition on the external force. However, since the release layer 12 has a very small thickness, it may not be continuously stretched and may be torn by the external force. Thus, when the same external force is exerted on layers, the release layer 12 having the second thickness T2 may be torn before the conductive polymer substrate layer 11 having the first thickness T1. For example, in some example embodiments, the release layer 12 may be formed on the conductive polymer substrate layer 11 at such a thickness that the release layer 12 undergoes inelastic deformation and tearing (and/or fracturing) while the polymer substrate layer 11 undergoes elastic deformation.

A release film according to some example embodiments may be fabricated by the following method.

Porous fibers, which are formed to have a woven and/or non-woven fabric structure, may be prepared. A conductive polymer substrate layer may be formed by coating the porous fibers with a conductive polymer material. For example, the conductive polymer substrate layer may be formed by coating a conductive polymer material on a non-woven fabric using a spray coating process.

Alternatively, the conductive polymer substrate layer may be formed by fabricating a material, which contains polymer powder (e.g., polyethylene terephthalate (PET)) and conductive polymer (0.1% to 1%) in a shape of a non-woven fabric, using a spun bond method.

A solution may be prepared by supplying a fluorine-based polymer composite in a solvent. In some example embodiments, the solvent may include an organic and/or a fluorine-based solvent. In some example embodiments, the fluorine-based polymer composite may include at least one material containing one or more C—F bonds (e.g., fluoropolymer and perfluoropolymer). For example, the fluorine-based polymer composite may include at least one of ethylene tetrafluoroethylene (ETFE), polytetrafluoroethylene (PTFE), perfluorooctanoic acid (PFOA), and/or the like. In some example embodiments, an additive agent, such as catalyzer, may be further added in the solvent.

Release layers may be formed on opposite surfaces (e.g., top and bottom surfaces) of the conductive polymer substrate layer by performing a coating process on the conductive polymer substrate layer (e.g., in a manner of dipping the substrate layer into the solution) and performing a drying process thereon.

FIGS. 5, 6, 7, 9, and 10 are sectional views illustrating a process of manufacturing a semiconductor package using the release film. FIG. 8 is an enlarged sectional view illustrating a portion 'cc' of FIG. 7.

Figure 5:
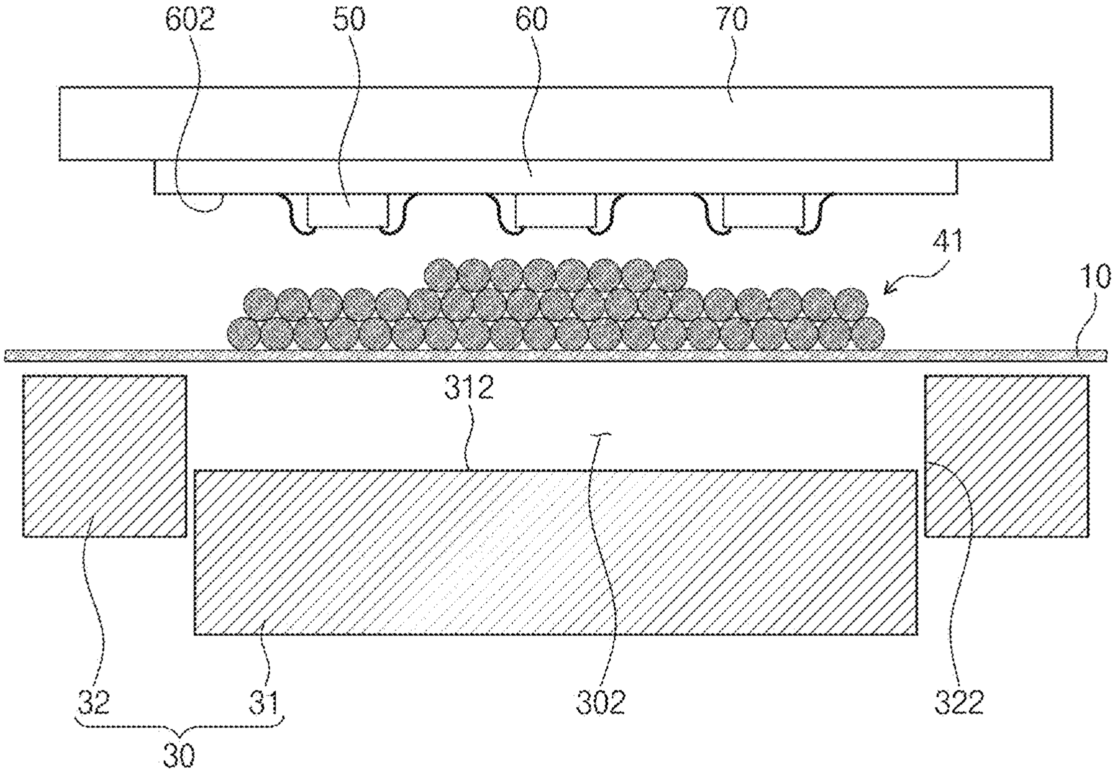
FIGS. 5, 6, 7, 9, and 10 are sectional views illustrating a process of manufacturing a semiconductor package using the release film.

Referring to FIG. 5, a mold 30 with a cavity 302 may be provided. The mold 30 may be formed of and/or include at least one of conductive or metallic materials. The mold 30 may be, for example, grounded and/or may serve as a ground. The mold 30 may include a base portion 31 and a frame portion 32 enclosing the base portion 31.

A top surface 312 of the base portion 31 may be referred to as the inner bottom surface 312 of the mold 30. A side surface 322 of the frame portion 32 adjacent to the base portion 31 may be referred to as the inner side surface 322 of the mold 30. A space, which is defined by the inner bottom surface 312 of the mold 30 and the inner side surface 322 of the mold 30, may correspond to the cavity 302.

The release film 10 may be provided on the mold 30, and a molding powder 41 may be provided on the release film 10. In some example embodiment, the molding powder 41 may be formed of and/or include an epoxy molding compound and/or an epoxy molding pre-cursor.

A carrier substrate 70 may be provided on the mold 30, and the release film 10 may be interposed between them. A package substrate 60 and semiconductor devices 50 may be provided on a surface of the carrier substrate 70 adjacent to the mold 30. In some example embodiments, the package substrate 60 may be a printed circuit board (PCB). The semiconductor devices 50 may be mounted on a first surface 602 of the package substrate 60 adjacent to the mold 30.

Figure 6:
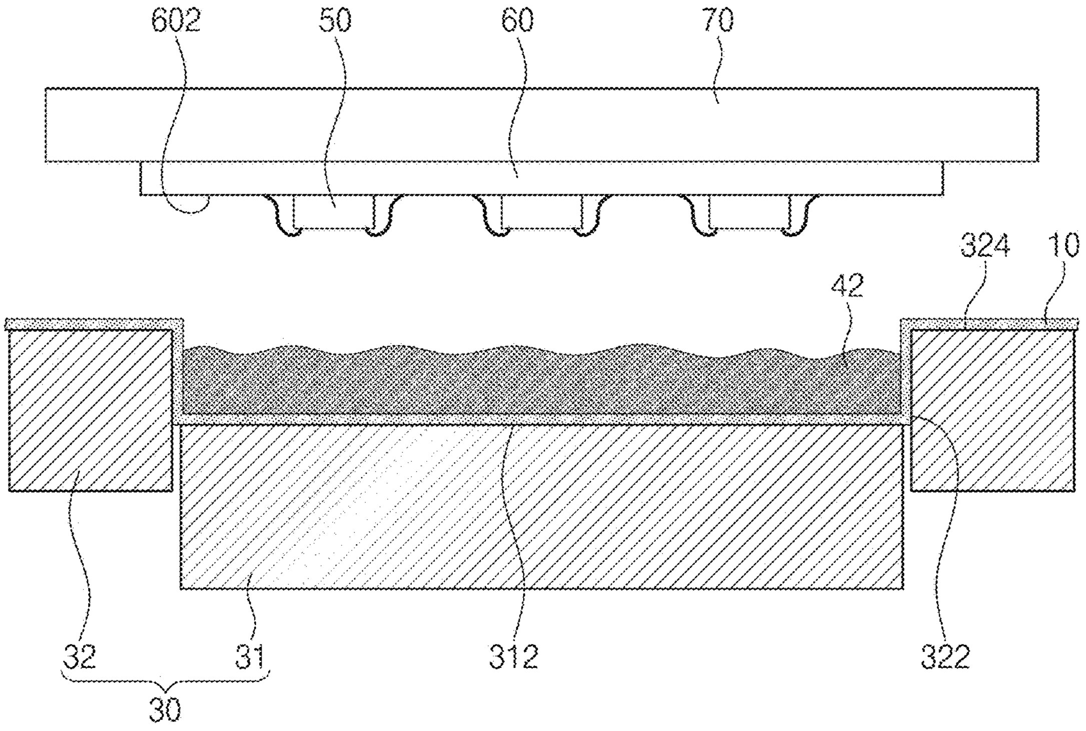

Referring to FIG. 6, the mold 30 may include at least one pathway (not shown), which is connected to the cavity 302 of FIG. 5, and a vacuum suction operation may be performed through the pathway. As a result, the release film 10 may be in close contact with the inner bottom surface 312 of the mold 30 and the inner side surface 322 of the mold 30. In some example embodiment, the release film 10 may be in contact with a top surface of the frame portion 32. The molding member 42 having a fluidic property may be formed, e.g., by heating the molding powder 41 of FIG. 5.

Figure 7:
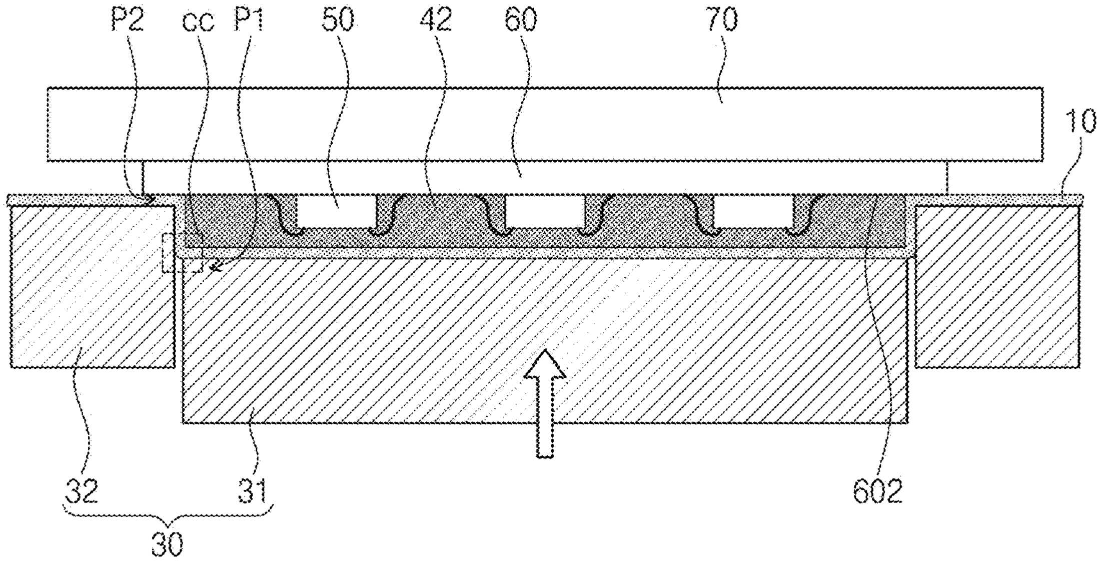

Referring to FIG. 7, the semiconductor devices 50 may be disposed into the molding member 42. In some example embodiments, the mold 30 may be moved toward the first surface 602 of the package substrate 60. The molding member 42 of FIG. 6 may cover the first surface 602 of the package substrate 60 and the semiconductor devices 50. The frame portion 32 may be immobilized, and the base portion 31 may be moved in an upward direction to further press the molding member 42 against the semiconductor device 50 and the package substrate 60. A portion (e.g., P2) of the release film 10 on a top surface 324 of the frame portion 32 may be in contact with the first surface 602 of the package substrate 60.

The release film 10 may be stretched and/or deformed during this process. The stretching and/or deformation of the release film 10 may occur most actively near a portion P1, where the inner bottom surface 312 of the mold 30 is connected to the inner side surface 322 of the mold 30.

Figure 8:
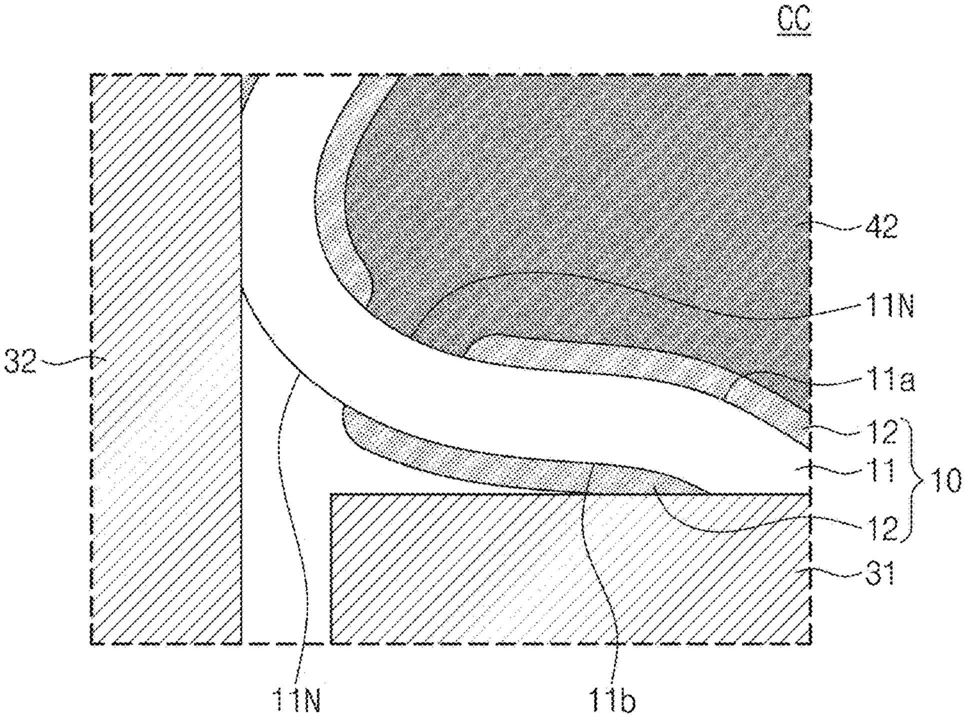
FIG. 8 is an enlarged sectional view illustrating a portion 'cc' of FIG. 7.

Referring to FIG. 8, as a result of the stretching of the release film 10, the conductive polymer substrate layer 11 may have one or more portions 11N, which are exposed from the release layers 12, as shown in FIGS. 3 and 4.

As an example, the exposed portion 11N of the conductive polymer substrate layer 11 may be formed on the first surface 11*a* to be in contact with the molding member 42 and may be formed on the second surface 11*b* to be in contact with the base portion 31 and/or the frame portion 32. In some examples, the exposed portion 11N may correspond to an area of greatest deformation in the release film 10.

Figure 9:
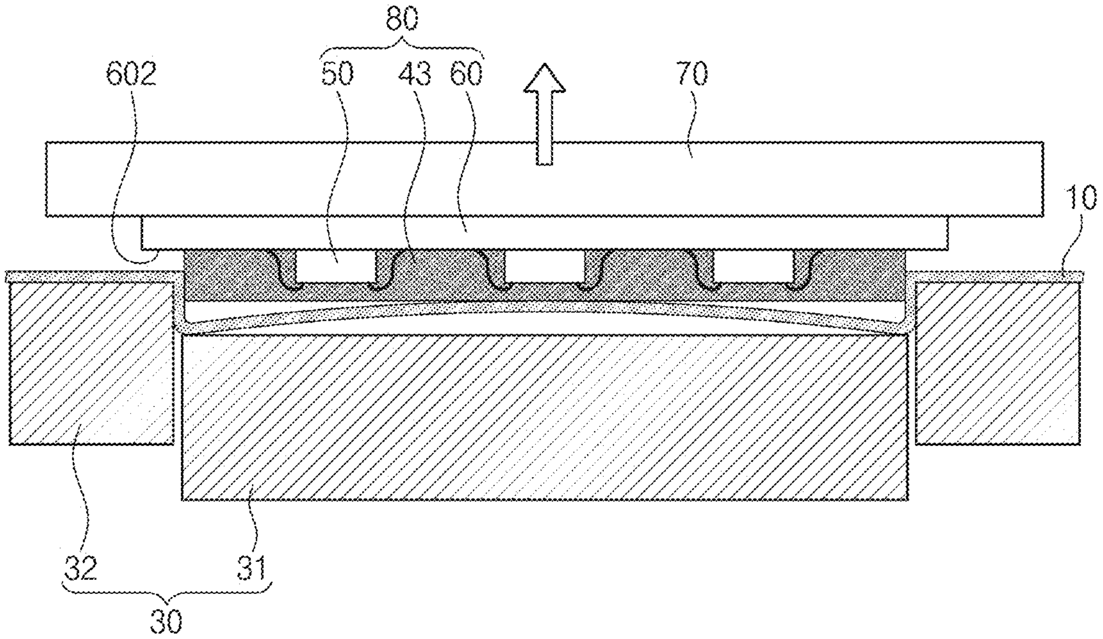

Referring to FIG. 9, a molding structure 43 may be formed by hardening the molding member 42 of FIG. 8. The package substrate 60, the semiconductor devices 50, and the molding structure 43 may form a package structure 80. Thereafter, the package structure 80 may be detached from the release film 10.

In the case where a separation process is performed to detach layers, which are formed of different kinds of materials and are in contact with each other, from each other, an electrostatic phenomenon may occur. In a comparative example, where a single film, which is made of fluorine compound, has been used as the release film. According to the known triboelectric series, the fluorine-compound-based single release film is negatively charged with ease, while positively charging an object which is in contact with the same, during the detaching process, and thus, it may easily cause an electrostatic phenomenon. For example, the use of the fluorine-compound-based release film may lead to an electrostatic discharging issue and the consequent failure of the semiconductor device.

According to some example embodiments of the inventive concepts, in the case where the release film 10 is stretched, the conductive polymer substrate layer 11 may be exposed to the outside of the release layer 12. The exposed portion 11N of the conductive polymer substrate layer 11 may be in contact with the molding structure 43 and the mold 30. In these cases, during the process of detaching the release layer 12 from the molding structure 43, electric charges may be discharged to the mold 30 through the conductive polymer substrate layer 11, and thus, it may be possible to lower a discharging voltage and/or to suppress the electrostatic discharging phenomenon.

Since the conductive polymer substrate layer 11 is provided to have a porous woven or non-woven fabric structure, it may have elongation that is suitable for the release film. As an example, the conductive polymer substrate layer 11 may not be torn or cut by the release film stretching process, which is performed for the vacuum suction, the motion of the base portion, and/or the separation of the package structure.

In addition, the release layer 12 may include a material that can be easily detached from the molding structure 43, may have a contact area that is larger than that of the conductive polymer substrate layer 11, and/or may have a sufficiently small thickness, compared with the conductive polymer substrate layer 11, and thus, the conductive polymer substrate layer 11 may be exposed to the outside of the release layer 12 by the stretching process.

Figure 10:
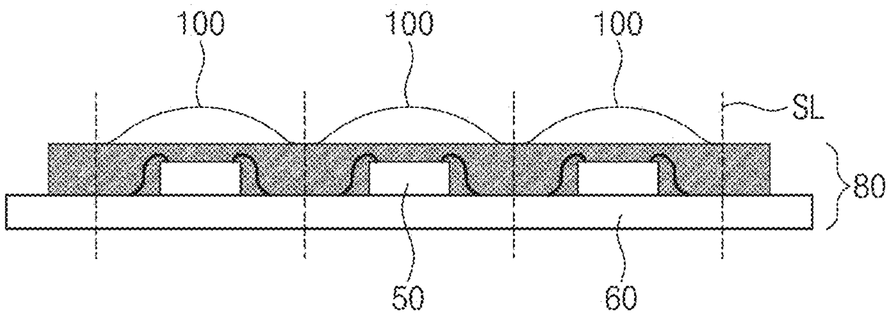

Referring to FIG. 10, a sawing process of cutting the package structure 80 along a sawing line SL may be performed to form a plurality of semiconductor packages 100.

Hereinafter, some features in the inventive concepts and the consequent effects will be described in more detail by comparing some example embodiments of the inventive concepts with comparative examples. However, the following example embodiments will be given to describe the inventive concepts more specifically, and the example embodiments are not limited to these examples.

Example Embodiment 1

A substrate layer including a spun bond non-woven fabric of polyethylene terephthalate (PET) was prepared. Top and bottom surfaces of the substrate layer were coated with conductive polymer (PEDOT:PSS) using a spray coating process. Thereafter, the substrate layer was dipped into solution containing fluorine-containing composite (AGC's CYTOP™ Type S). Next, the substrate layer was taken out of the solution and was hardened.

Example Embodiment 2

A substrate layer was prepared in the same manner as the example embodiment 1, except for that the spun bond non-woven fabric was prepared to have a thickness lager than that in the example embodiment 1.

Comparative Example 1

A substrate layer was prepared to include an ethylene tetrafluoroethylene (ETFE) film, instead of the spun bond non-woven fabric. Thereafter, any additional process is not performed.

Comparative Example 2

A substrate layer was prepared to include a polyethylene terephthalate (PET) film (TACS's TS-502S), instead of the spun bond non-woven fabric. Top and bottom surfaces of the substrate layer were not coated with a conductive polymer. The subsequent process was performed in the same manner as the example embodiment 1.

Experimental Example

1. Measurement of Density of Substrate Layer

In the example embodiments 1 and 2 and the comparative example 2, after the spray coating step of the conductive polymer, the substrate layer was cut to form a sample having an area of 5 cm×5 cm. A weight of the cut sample was measured, and a density of the sample was calculated by dividing the weight by a volume of the sample. In the comparative example 1, the density was measured in the same manner 2. Measurement of Elongation of Substrate Layer In the example embodiments 1 and 2 and the comparative example 2, after the spray coating step of the conductive polymer, the substrate layer was cut to form a sample having a size of 2.5 cm×10 cm. Elongation of the cut sample was measured through a process of stretching the sample until it is torn. In the comparative example 1, the elongation was measured in the same manner 3. Measurement of Weight Ratio of Release Layer In the example embodiments 1 and 2 and the comparative example 2, a mass of the substrate layer was measured before and after the solution dipping coating step. A weight ratio of the release layer was calculated by dividing a value, which was obtained by subtracting the mass of the substrate layer before the dip coating step from the mass after the dip coating step, by the mass of the substrate layer before the dip coating step.

4. Measurement of Thickness of Release Layer

In the example embodiments 1 and 2 and the comparative example 2, a thickness of the substrate layer was measured before the solution dipping coating step and after the solution dipping coating step.

5. Measurement of Sheet Resistance of Release Film

Sheet resistances in the example embodiments 1, and 2, and comparative examples 1 and 2 were measured by applying a voltage of 100V for 10 seconds using a sheet resistance measuring apparatus (e.g., MCA-HT800 Nittoseiko analytech).

6. Measurement of Failure Rate after Semiconductor Package Molding Process

An ESD failure rate (parts per million (ppm)) was measured on 10000 package samples, which were fabricated according to the example embodiments 1, and 2, and comparative example 1 and 2, using a DC test apparatus.

TABLE 1

| | Density ($g/cm^3$) of substrate layer | Elongation (%) of substrate layer | Weight ratio (%) of release layer | Thickness (μm) of release layer (B/A solution coating) | Sheet resistance (Ω/sq) of release film after molding process | Failure rate (ppm) after package molding process |
|---|---|---|---|---|---|---|
| Embodiment 1 | 0.2 | 100 | 10 | 50/52 | $10^9$ | 0 |
| Embodiment 2 | 0.2 | 100 | 10 | 100/103 | $10^9$ | 0 |
| Comparative example 1 | 1.4 | 300 | 100 | 65/65 | very high (over) | 400 |
| Comparative example 2 | 1.1 | 10 | 10 | 50/53 | very high (over) | >400 |

As shown in Table 1, although the substrate layer of the same material (e.g., PET) were prepared in the example embodiments 1 and 2 and the comparative example 2, the densities in the example embodiments 1 and 2 were smaller than that in the comparative example 2, and the elongation values were greater in the example embodiments 1 and 2 than in the comparative example 2. This shows that the samples in the example embodiments 1 and 2 (e.g., composed of the porous non-woven fabric) can have a relatively small density and a good stretching property. In the example embodiments 1 and 2, the release layer formed on the substrate layer had about 10% of a total weight and had a thickness of 2 μm to 3 μm. Table 1 also shows that the sheet resistance was smaller in the example embodiments 1 and 2 than in the comparative examples 1 and 2. This shows that, by using the thin release layer and the conductive polymer substrate layer, it may be possible to reduce the sheet resistance.

Table 1 shows that a failure rate measured after the semiconductor package molding process was smaller in the example embodiments 1 and 2 than in the comparative examples 1 and 2. This shows that the electrostatic discharging issue was reduced in the process of detaching a package structure from a mold.

According to some example embodiments of the inventive concepts, a release film may include a conductive polymer substrate layer and release layers provided on top and bottom surfaces thereof. In the case where the release film is stretched, the conductive polymer substrate layer may be exposed through the release layer, and such an exposed portion may be in contact with a molding material and a metal mold. When the release layer is detached from the molding material, electric charges may be discharged to the metal mold through the conductive polymer substrate layer. Accordingly, it may be possible to suppress a static electricity issue.

While some example embodiments of the inventive concepts have been particularly shown and described, it will be understood by one of ordinary skill in the art that variations in form and detail may be made therein without departing from the spirit and scope of the attached claims.

What is claimed is:

1. A release film, comprising:

a conductive polymer substrate layer; and release layers on a top surface and a bottom surface of the conductive polymer substrate layer, wherein each of the release layers comprises a fluorine-based polymer, and a density of the conductive polymer substrate layer ranges from 0.1 g/cm$^3$ to 0.5 g/cm$^3$, wherein the conductive polymer substrate layer is thicker than each of the release layers, and wherein a sheet resistance of the release film is greater than or equal to $10^8$ Ω/sq and less than $10^{10}$ Ω/sq.

2. The release film of claim 1, wherein the conductive polymer substrate layer has a thickness between 30 μm to 150 μm, and each of the release layers has a thickness between 0.1 μm to 20 μm.

3. The release film of claim 2, wherein the conductive polymer substrate layer has a thickness between 40 μm to 80 μm, and each of the release layers has a thickness between 0.5 μm to 5 μm.

4. The release film of claim 1, wherein the conductive polymer substrate layer has at least one of a woven or non-woven fabric structure.

5. The release film of claim 1, wherein a weight ratio between the conductive polymer substrate layer and the release layers is between 8:1 to 9:1.

6. The release film of claim 1, wherein the conductive polymer substrate layer comprises a porous fiber; and a conductive polymer material coated on the porous fiber.

7. The release film of claim 6, wherein the porous fiber comprises at least one of polyethylene naphthalate, polyimide, nylon, or polyester.

8. The release film of claim 6, wherein the conductive polymer material comprises at least one of poly(3,4-ethylenedioxythiophene) polystyrene sulfonate (PEDOT:PSS), polypyrrole, polythiophene, or polyaniline.

9. The release film of claim 6, wherein each of the release layers comprises at least one of fluoropolymer or perfluoropolymer.

10. The release film of claim 1, wherein the conductive polymer substrate layer comprises a porous conductive fiber.

11. A release film, comprising:

a conductive polymer substrate layer; and release layers on a top surface and a bottom surface of the conductive polymer substrate layer, wherein each of the release layers comprises a fluorine-based polymer, wherein the conductive polymer substrate layer has a thickness between 40 μm to 80 μm, and each of the release layers has a thickness between 0.5 μm to 5 μm, and wherein the conductive polymer substrate layer is thicker than each of the release layers, and wherein a sheet resistance of the release film is greater than or equal to $10^8$ Ω/sq and less than $10^{10}$ Ω/sq.

12. The release film of claim 11, wherein the conductive polymer substrate layer has a first elongation, and each of the release layers has a second elongation greater than the first elongation.

13. The release film of claim 11, wherein a density of the conductive polymer substrate layer is smaller than a density of each of the release layers.

14. The release film of claim 11, wherein the conductive polymer substrate layer comprises a porous fiber and a conductive polymer material coated on the porous fiber, the porous fiber comprises at least one of polyethylene naphthalate, polyimide, nylon, or polyester, the conductive polymer material comprises at least one of poly(3,4-ethylenedioxythiophene) polystyrene sulfonate (PEDOT:PSS), polypyrrole, polythiophene, or polyaniline, and each of the release layers comprises at least one of ethylene tetrafluoroethylene (ETFE), polytetrafluoroethylene (PTFE), or perfluorooctanoic acid (PFOA).

* * * * *